(12) United States Patent
Nakamura et al.

(10) Patent No.: US 7,667,301 B2
(45) Date of Patent: Feb. 23, 2010

(54) THERMAL TREATMENT APPARATUS, METHOD FOR MANUFACTURING SEMICONDUCTOR DEVICE, AND METHOD FOR MANUFACTURING SUBSTRATE

(75) Inventors: Naoto Nakamura, Toyama (JP); Iwao Nakamura, Toyama (JP); Tomoharu Shimada, Nagasaki (JP); Kenichi Ishiguro, Toyama (JP); Sadao Nakashima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 561 days.

(21) Appl. No.: 10/528,069

(22) PCT Filed: Sep. 26, 2003

(86) PCT No.: PCT/JP03/12353

§ 371 (c)(1),
(2), (4) Date: Jul. 10, 2006

(87) PCT Pub. No.: WO2004/030073

PCT Pub. Date: Apr. 8, 2004

(65) Prior Publication Data

US 2007/0194411 A1    Aug. 23, 2007

(30) Foreign Application Priority Data

Sep. 27, 2002  (JP) ............................. 2002-282231
Feb. 27, 2003  (JP) ............................. 2003-051243
Feb. 27, 2003  (JP) ............................. 2003-051244

(51) Int. Cl.
   *H01L 23/58* (2006.01)
(52) U.S. Cl. ................ 257/633; 257/635; 257/E23.001

(58) Field of Classification Search ................ 257/633, 257/635, 646, 649, 675, 706, E23.001; 118/720, 118/728
See application file for complete search history.

(56) References Cited

FOREIGN PATENT DOCUMENTS

| JP | A-61-267317 | 11/1986 |
| JP | 07-161654 | 6/1995 |
| JP | 09-260470 | 10/1997 |
| JP | 10-242067 | 9/1998 |
| JP | 10-242254 | 9/1998 |
| JP | 11-340155 | 12/1999 |
| JP | 2001-358086 | 12/2001 |
| JP | 2002-231726 | 8/2002 |
| JP | A-2002-033284 | 6/2009 |
| KR | 97-53476 | 7/1997 |

*Primary Examiner*—Davienne Monbleau
*Assistant Examiner*—Hoa B Trinh
(74) *Attorney, Agent, or Firm*—Oliff & Berridge, PLC

(57) ABSTRACT

A thermal treatment apparatus, a method for manufacturing a semiconductor device, and a method for manufacturing a substrate, wherein the occurrence of slip dislocation in a substrate during heat treatment is reduced, and a high-quality semiconductor device can be manufactured, are intended to be provided.

A substrate support 30 is formed from a main body portion 56 and a supporting portion 58. In the main body portion 56, a plurality of placing portions 66 extend parallel, and supporting portions 58 are provided on the placing portions 66. A substrate 68 is placed on the supporting portion 58. The supporting portion 58 has a smaller area than an area of a flat face of the substrate, and is formed from a silicon plate having a thickness larger than thickness of the substrate, so that deformation during heat treatment is reduced. The supporting portion 58 is made of silicon, and a layer coated with silicon carbide (SiC) is formed on a substrate-placing face of the supporting portion 58.

7 Claims, 11 Drawing Sheets

THERMAL TREATMENT APPARATUS, METHOD FOR MANUFACTURING SEMICONDUCTOR DEVICE, AND METHOD FOR MANUFACTURING SUBSTRATE

TECHNICAL FIELD

The present invention relates to thermal treatment apparatus for heat-treating a semiconductor wafer, glass substrate and the like, a method for manufacturing a semiconductor device, and a method for manufacturing a semiconductor wafer or a glass substrate.

BACKGROUND ART

When a plural number of substrates such as silicon wafers are heat-treated using, for example, a vertical heat treatment furnace, a substrate support (boat) made of silicon carbide is used. In the substrate support, for example, a supporting groove for supporting a substrate at three points is provided.

In this case, there has been a problem that when the heat treatment is performed at a temperature of about 1000° C. or more, slip dislocation occurs in the substrate near the supporting groove, which may grow into a slip line. When the slip line occurs, flatness of the substrate becomes worse. Therefore, there has been a problem that misalignment of mask (misalignment of mask due to defocusing or deformation) occurs in a lithography process that is one of important processes in a LSI manufacturing process, and thus manufacture of LSI having a desired pattern is difficult.

As means for solving such a problem, a technique is known, wherein first, a dummy wafer is placed in the supporting groove, and then a substrate to be treated is placed on the dummy wafer (refer to patent literature 1). The technique intends that the conventional three-point-support is changed to face-support using the dummy wafer, thereby stress concentration by empty-weight of the substrate to be processed is suppressed and thus warp of the substrate is prevented, and thereby occurrence of the slip dislocation is prevented.

As one of the substrate supports of this type, a boat material such as Si-SiC, on which CVD-SiC coating is formed to prevent impurity contamination from the material, is known (refer to patent literature 2). According to the known example, the CVD-SiC coating is 30 μm to 100 μm in thickness. That is, when the thickness of the coating is less than 30 μm, impurities are diffused from the boat material to a surface of the coating, therefore the object of the CVD coating, or prevention of impurity diffusion by the coating, can not be achieved, and when the thickness of the coating is more than 100 μm, a padding condition that CVD is concentratively deposited onto an edge portion of the boat material occurs, and if the boat (substrate support) is used in this condition, burrs are formed, causing particle contamination.

As another conventional example, a substrate support is known, wherein a SiC film is formed onto a base material such as Si-impregnated sintered-SiC material or graphite by CVD method, so that heat resistance, impact resistance, oxidation resistance, and corrosion resistance are improved (refer to patent literature 3). According to the known example, thickness of the SiC film is preferably 20 μm to 200 μm, and when it is less than 20 μm, since the SiC film itself is damaged, life of the film may be reduced, and when it is more than 200 μm, the SiC film is easily separated.

As still another conventional example, a jig (boat and the like) made of SiC is known, wherein the CVD-SiC coating is applied on a surface of the jig, and a $SiO_2$ film is formed on a surface of the coating (refer to patent literature 4). It is shown from the known example that the SiC coating is for securing uniformity of a surface of the base material, and the thickness of the SiC film is 100 μm, as a practical example. Moreover, it is shown that the $SiO_2$ film is formed for preventing reduction in thickness of the base material in dry cleaning using $ClF_3$, and thickness of the film is desirably 10 Å to 100 μm.

As still another conventional example, it is known that the CVD-SiC is coated about 100 μm on a surface of a support made of Si—SiC (refer to patent literature 5).

[Patent literature 1] JP-A-2000-223495.
[Patent literature 2] JP-A-2000-164522.
[Patent literature 3] JP-A-2002-274983.
[Patent literature 4] JP-A-10-242254.
[Patent literature 5] JP-A-10-321543.

DISCLOSURE OF THE INVENTION

However, according to results of experiments by the inventor, although the above conventional examples where the substrate is placed on the dummy wafer become better compared with the example using the three-point-support, they are insufficient in a point of preventing the slip dislocation because of occurrence of the slip line.

It is considered that this is because since the dummy wafer is thin like the substrate, for example 700 μm thick, the dummy wafer is deformed due to difference in thermal expansion generated between the dummy wafer and a substrate support comprising silicon carbide or other stress, and the slip dislocation occurs in the substrate due to the deformation of the dummy wafer.

It is found from the results of the experiments by the inventors of the application that in some material or thickness of the film coated on a substrate-placing face of the supporting portion of the substrate support, the slip may occur due to a thermal expansion coefficient of the film and the like.

Thus, the invention intends to provide thermal treatment apparatus, a method for manufacturing a semiconductor device, and a method for manufacturing a substrate, wherein the slip dislocation occurring in the substrate during heat treatment is reduced, and thus a high-quality semiconductor device can be manufactured.

To solve the above problem, a first feature of the invention is thermal treatment apparatus that performs heat treatment with a substrate being supported by a substrate support, wherein the substrate support has a main body portion and a supporting portion which is provided on the main body portion and in contact with the substrate, and the supporting portion comprises a silicon platelike-member having a larger thickness than thickness of the substrate. The thickness of the supporting portion is larger than the thickness of the substrate, preferably 10 mm or less, for example 3 mm to 6 mm, and more preferably 4 mm to 5 mm. When the thickness of the supporting portion is compared to the thickness of the substrate, preferably the thickness of the supporting portion is at least twice the thickness of the substrate.

The substrate support can be configured as a boat where a plurality of placing portions extend parallel from the body. The body comprises, for example, silicon carbide. The supporting portion may be in any shape that the substrate can be placed on one end face of the portion, including cylinder, elliptic cylinder, and polygonal cylinder. The supporting portion preferably has a larger thickness than thickness of a placing portion of the main body.

A second feature of the invention is thermal treatment apparatus that performs heat treatment with a substrate being supported by a substrate support, wherein the substrate support has a main body portion and a supporting portion which is provided on the main body portion and in contact with the substrate, and the supporting portion is made of silicon, and a substrate-placing face of the supporting portion, on which the substrate is placed, is coated with a film comprising one or a plural number of materials of silicon carbide (SiC), silicon oxide ($SiO_2$), silicon nitride ($Si_3O_4$), glassy carbon, and microcrystalline diamond.

The invention is an invention where the silicon supporting-portion having the same hardness or thermal expansion coefficient as the substrate is coated with an anti-adhesion film such as silicon carbide film, and the objects, constitution, and operation and effects of the invention are completely different from the aforementioned conventional examples described in patent literatures 2 to 5, wherein the supporting portion mainly comprises silicon carbide, and silicon carbide and the like is coated thereon.

When a silicon carbide film is coated, thickness of the film is preferably 0.1 μm to 50 μm, more preferably 0.1 μm to 15 μm, and further preferably 0.1 μm to 3 μm.

When the thickness of the silicon supporting-portion and the thickness of the silicon carbide film are shown in a ratio between the two, the thickness of the silicon carbide film is preferably 0.0025% to 1.25% of the thickness of the silicon supporting-portion, more preferably 0.0025% to 0.38%, and further preferably 0.0025% to 0.25%.

For the film coated on the silicon supporting-portion, the silicon nitride ($Si_3O_4$) can be used in addition to the silicon carbide (SiC). When the silicon nitride film is used, thickness of the film is preferably 0.1 μm to 30 μm, and more preferably 0.1 μm to 5 μm.

A third feature of the invention is thermal treatment apparatus that performs heat treatment with a substrate being supported by the substrate support, wherein the substrate support has a main body portion and a supporting portion which is provided on the main body portion and in contact with the substrate, and the supporting portion is made of silicon, and a plural number of different films are stacked on a substrate-placing face of the supporting portion, and hardness of an uppermost film is the lowest in the plural number of films at heat treatment temperature, or the uppermost film is amorphous.

Here, at least one of the plural number of stacked films preferably comprises a material selected from the silicon carbide (SiC), silicon nitride (SiN), polycrystalline silicon (Poly-Si), silicon oxide ($SiO_2$), glassy carbon, and microcrystalline diamond. In this way, the material having high heat resistance is stacked on the silicon supporting-portion, thereby adhesion between the substrate and the supporting portion can be prevented.

The uppermost surface (face contacting to the substrate) of the plural number of films preferably comprises a material having a lower hardness than that of other films during heat treatment, such as silicon oxide ($SiO_2$).

It is further preferable that material of the uppermost surface has hardness lower than that of other films and lower than that of the substrate during heat treatment. The $SiO_2$ of the uppermost surface is preferably amorphous.

When two layers are formed as the stacked films, it is preferable that one of them is a silicon carbide film, and an uppermost film is a silicon oxide film.

The main body portion of the substrate support may comprise silicon carbide (SiC).

While the substrate support may be a sheet-type one for supporting a single substrate, it can be configured in a way that a plural number of substrates are supported approximately horizontally with a gap in a plural number of stages.

The thermal treatment apparatus can be used as thermal treatment apparatus for treating the substrate at high temperature of 1000° C. or more, in addition, 1350° C. or more.

A fourth feature of the invention is the thermal treatment apparatus that performs heat treatment with a substrate being supported by a substrate support, wherein the substrate support has a main body portion and a supporting portion which is provided on the main body portion and in contact with the substrate, and the supporting portion is made of silicon, and a silicon carbide (SiC) film is formed on a substrate-placing face of the supporting portion, and a silicon oxide ($SiO_2$) film is formed on an uppermost surface.

A fifth feature of the invention is thermal treatment apparatus that performs heat treatment with a substrate being supported by a substrate support, wherein the substrate support has a main body portion and a supporting portion which is provided on the main body portion and in contact with the substrate, and the supporting portion is made of silicon, and a coating film is formed on a substrate-placing face of the supporting portion, and hardness of the coating film is lower than hardness of the substrate during heat treatment at heat treatment temperature, or the coating film is amorphous.

A sixth feature of the invention is a method for manufacturing a substrate, comprising a process for carrying the substrate into a treatment room; a process for supporting the substrate by a supporting portion formed from a silicon plate-like-member having a larger thickness than thickness of the substrate; a process for heat-treating the substrate in the treatment room with the substrate being supported by the supporting portion, and a process for carrying out the substrate from the treatment room.

A seventh feature of the invention is a method for manufacturing a substrate, comprising a process for carrying the substrate into a treatment room; a process for supporting the substrate by a silicon supporting-portion wherein a substrate-placing face, on which the substrate is placed, is coated with a film comprising one or a plural number of materials of silicon carbide (SiC), silicon oxide ($SiO_2$), glassy carbon, and microcrystalline diamond; a process for heat-treating the substrate in the treatment room with the substrate being supported by the supporting portion; and a process for carrying out the substrate from the treatment room.

A eighth feature of the invention is a method for manufacturing a semiconductor device, comprising a process for carrying a substrate into a treatment room; a process for supporting the substrate by the supporting portion formed from a silicon platelike-member having a larger thickness than thickness of the substrate; a process for heat-treating the substrate in the treatment room with the substrate being supported by the supporting portion; and a process for carrying out the substrate from the treatment room.

A ninth feature of the invention is a method for manufacturing a semiconductor device, comprising a process for carrying a substrate into a treatment room; a process for supporting the substrate by a silicon supporting-portion wherein a substrate-placing face, on which the substrate is placed, is coated with a film comprising one or a plural number of materials of silicon carbide (SiC), silicon oxide ($SiO_2$), glassy carbon, and microcrystalline diamond; a process for heat-treating the substrate in the treatment room with the substrate being supported by the supporting portion; and a process for carrying out the substrate from the treatment room.

BEST MODE FOR CARRYING OUT THE INVENTION

Next, embodiments of the invention are described according to drawings.

Figure 1:
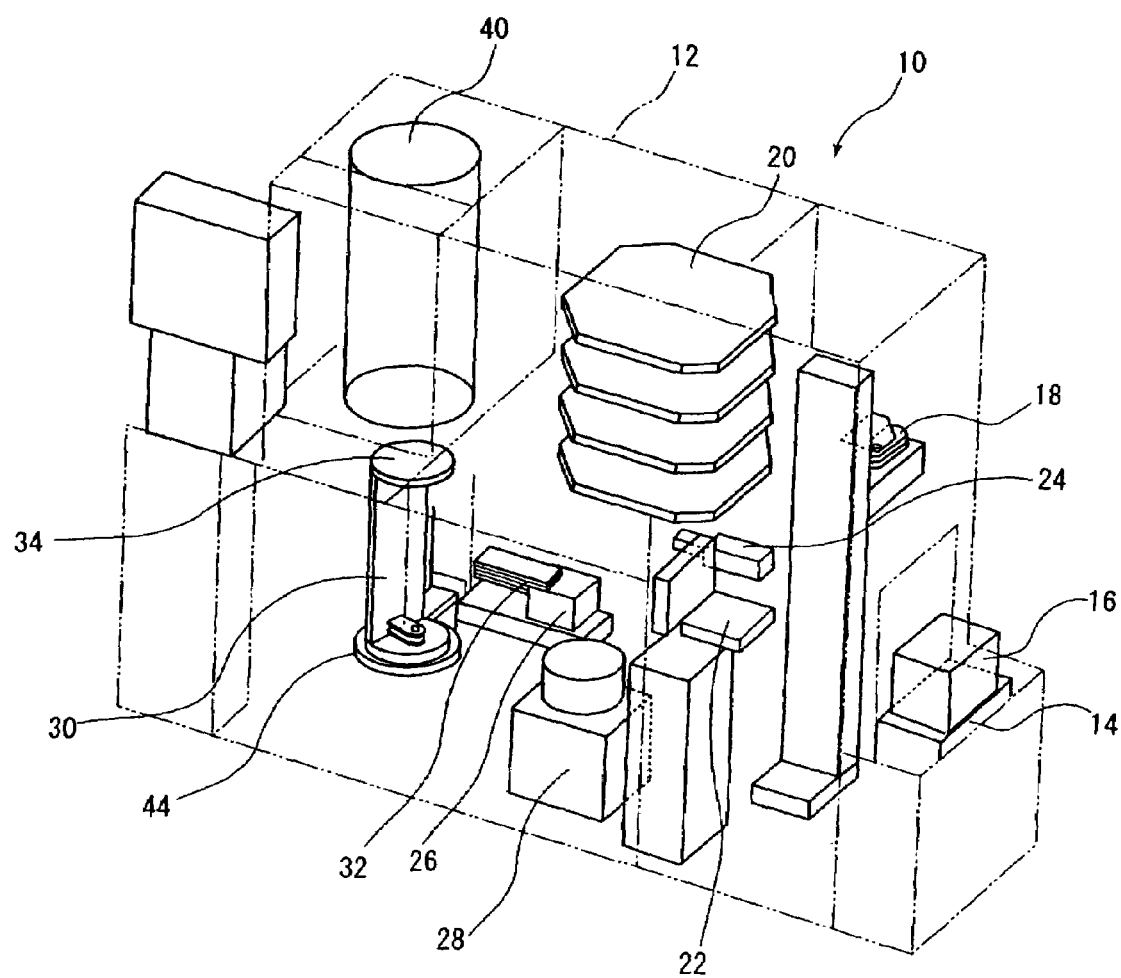
FIG. 1 is a perspective view showing thermal treatment apparatus according to an embodiment of the invention.

FIG. 1 shows thermal treatment apparatus 10 according to an embodiment of the invention. The thermal treatment apparatus 10 is, for example, vertical-type apparatus, and has a chassis 12 in which major parts of the apparatus are disposed. The chassis 12 is connected with a pod stage 14, and a pod 16 is carried onto the pod stage 14. The pod 16 receives, for example, 25 substrates, and is set on the pod stage 14 with a not-shown cap being closed.

In the chassis 12, a pod-carrying device 18 is disposed at a position opposed to the pod stage 14. Near the pod-carrying device 18, a pod shelf 20, a pod opener 22, and a sensor 24 of the number of substrates are disposed. The pod-carrying device 18 carries the pod 16 among the pod stage 14, pod shelf 20 and pod opener 22. The pod opener 22 is for opening the cap of the pod 16, and the number of substrates in the pod 16 with the cap being opened is sensed by the sensor 24 of the number of substrates.

Furthermore, a substrate transfer device 26, notch aligner 28 and substrate support 30 (boat) are disposed in the chassis 12. The substrate transfer device 26 has an arm 32 which can take out, for example, five substrates, and the substrates are carried among the pod placed at a position of the pod opener 22, notch aligner 28 and substrate support 30 by moving the arm 32. The notch aligner 28 detects a notch or an orientation-flat formed in the substrate, and arranges the notch or the orientation-flat in the substrate to a regular position.

Figure 2:
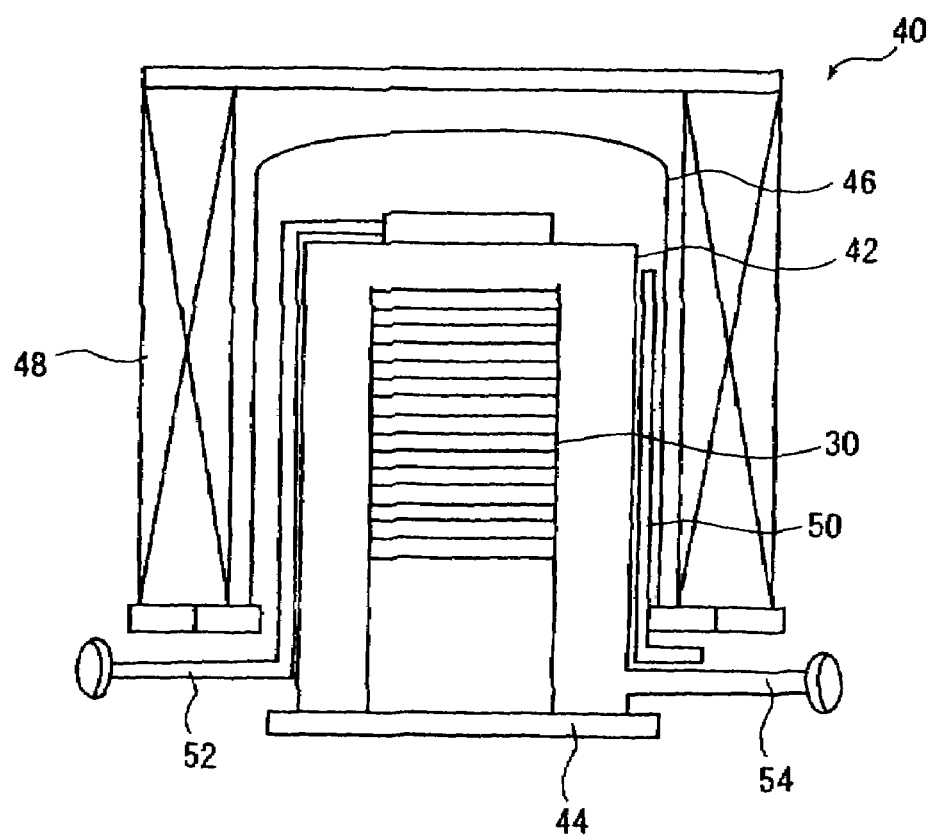
FIG. 2 is a cross section view showing a reactor used in the thermal treatment apparatus according to the embodiment of the invention.

FIG. 2 shows a reactor 40. The reactor 40 has a reactor tube 42, and a substrate support 30 is inserted into the reactor tube 42. A bottom area of the reactor tube 42 is opened for inserting the substrate support 30, and the opened area is sealed by a seal cap 44. Periphery of the reactor tube 42 is covered by a soaking tube 46, and a heater 48 is disposed around the soaking tube 46. A thermocouple 50 is disposed between the reactor tube 42 and the soaking tube 46, so that temperature in the reactor 40 can be monitored. The reactor tube 42 is connected with a introduction tube 52 for introducing treatment gas and an exhaust pipe 54 for exhausting the treatment gas.

Next, operation of the thermal treatment apparatus 10 configured as above is described.

First, when the pod 16 which has received a plural number of substrates is set on the pod stage 14, the pod 16 is carried from the pod stage 14 to the pod shelf 20 by the pod-carrying device 18, and stocked in the pod shelf 20. Next, the pod 16 stocked in the pod shelf 20 is carried and set onto the pod opener 22 by the pod-carrying device 18, and the cap of the pod 16 is opened by the pod opener 22, and then the number of substrates received in the pod 16 is sensed by the sensor 24 of the number of substrates.

Next, a substrate is taken out from the pod 16 located at a position of the pod opener 22 by the substrate transfer device 26, and transferred to the notch aligner 28. In the notch aligner 28, the notch is detected with the substrate being rotated, and the notches in the substrates are aligned to a fixed position according to the detected data. Next, the substrates are taken out from the notch aligner 28 by the substrate transfer device 26 and transferred to the substrate support 30.

In this way, after one batch of substrates are transferred to the substrate support 30, the substrate support 30 loaded with the substrates is charged into the reactor 40 in which temperature has been set to, for example, 700° C., and then the reactor tube 42 is sealed by the seal cap 44. Next, furnace temperature is increased to heat treatment temperature, and then the treatment gas is introduced through the introduction tube 52. The treatment gas includes nitrogen, argon, hydrogen, and oxygen. When the substrate is heat-treated, the substrate is heated to, for example, about 1000° C. or more. In this period, the heat treatment of the substrate is performed according to previously established programs of heating and heat treatment with monitoring temperature in the reactor tube 42 using the thermocouple 50.

When the heat treatment of the substrate is finished, the furnace temperature is lowered to about 700° C., and then the substrate support 30 is unloaded from the reactor 40, and the substrate support 30 is made to wait at a predetermined position until all substrates supported by the substrate support 30 are cooled. Again in lowering the furnace temperature, the cooling is performed according to a previously established cooling program with monitoring the temperature in the reactor tube 42 using the thermocouple 50. Next, when the substrates waiting in the substrate support 30 are cooled to the predetermined temperature, the substrates are taken out from the substrate support 30 by the substrate transfer device 26, and carried and received into an empty pod 16 set on the pod opener 22. Next, the pod 16 receiving the substrates are carried into the pod shelf 20 by the pod transfer device 18, and finally transferred onto the pod stage 14.

Next, the substrate support 30 is described in detail.

Figure 3:
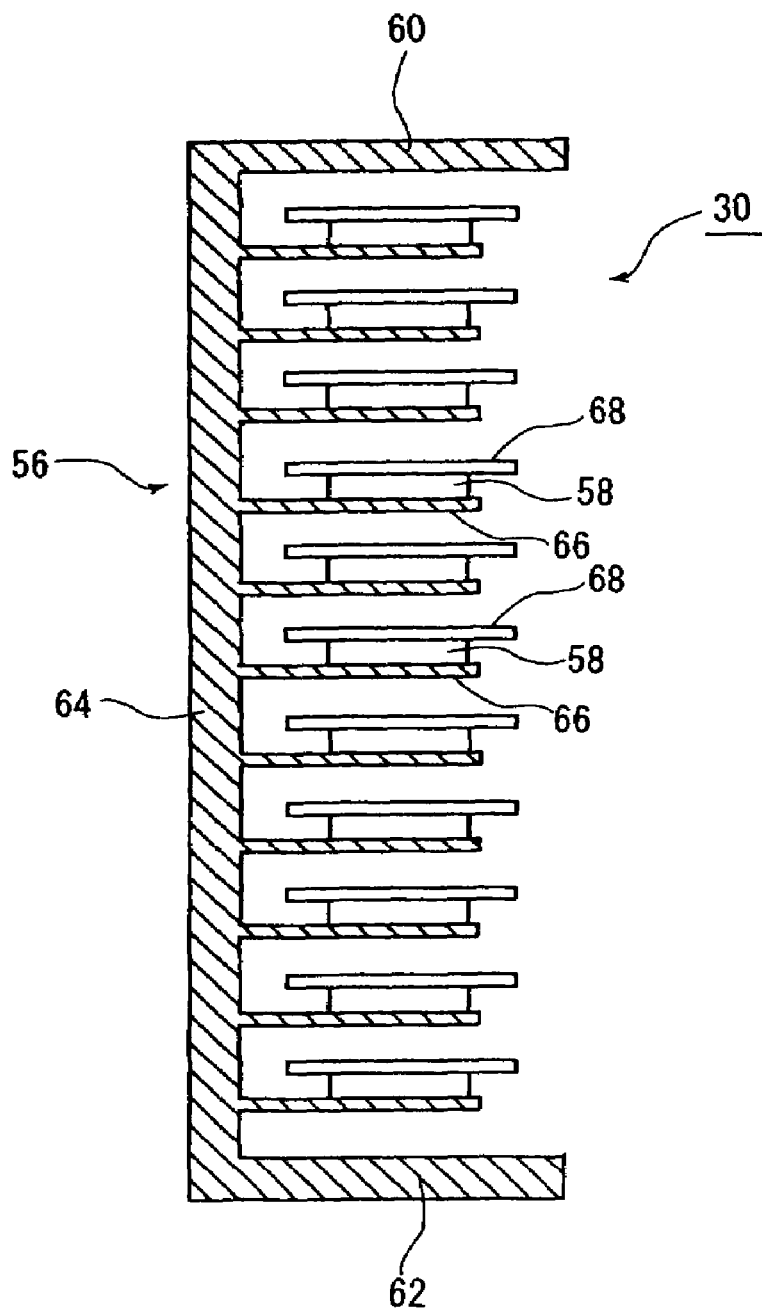
FIG. 3 is a cross section view showing a substrate support used in the thermal treatment apparatus according to the embodiment of the invention.
Figure 4:
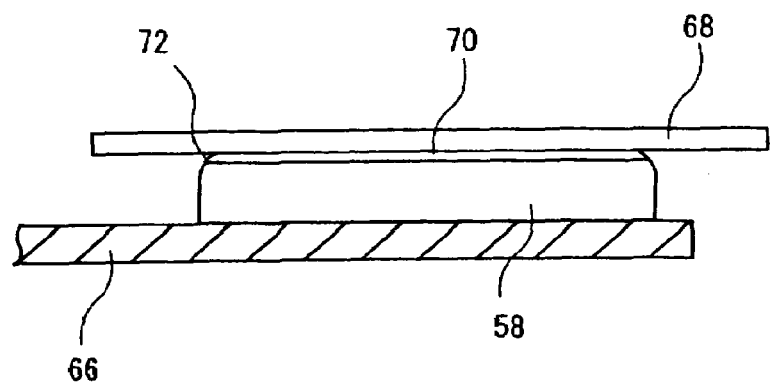
FIG. 4 is an expanded section view of the substrate support used in the thermal treatment apparatus according to the embodiment of the invention.
Figure 5:
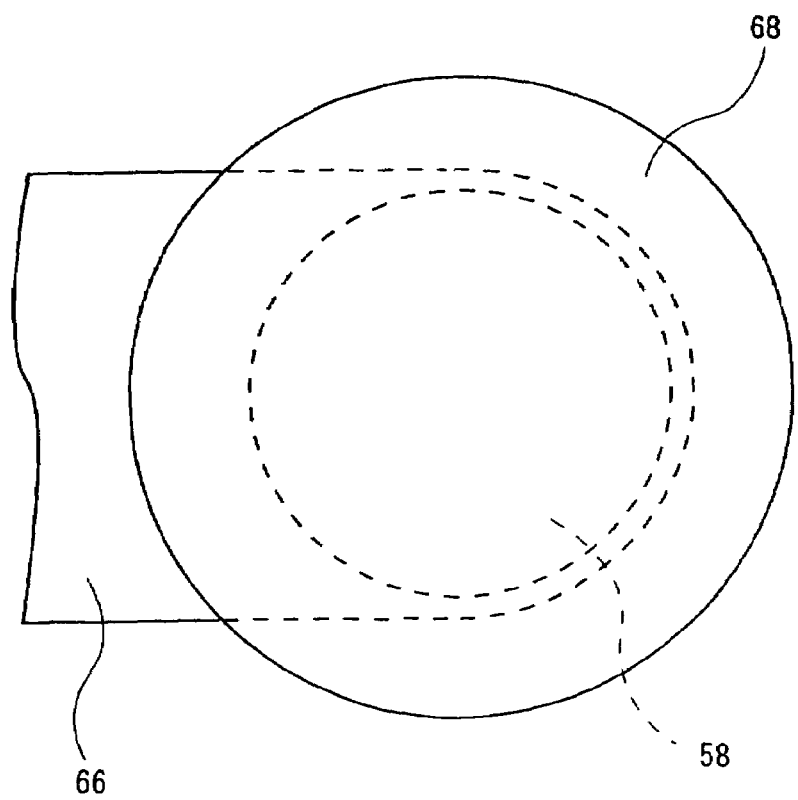
FIG. 5 is an expanded plan view of the substrate support used in the thermal treatment apparatus according to the embodiment of the invention.

In FIG. 3 to FIG. 5, the substrate support 30 is formed from a main body portion 56 and a supporting portion 58. The main body portion 56 comprises, for example, silicon carbide, and has an upper plate 60, a lower plate 62, and a pole 64 for connecting between the upper plate 60 and the lower plate 62.

In the main body portion 56, a plurality of placing portions 66 extending from the pole 64 to a side of the substrate transfer device 26 are formed parallel.

The supporting portion 58 comprises a silicon platelike-member, and is formed in the shape of a cylinder concentric with a substrate 68, and the supporting portion 58 is placed on the placing portion 66 in a condition that a bottom of the supporting portion 58 is in contact with a top of the placing portion 66, and the substrate 68 is placed and supported on the supporting portion 58 in a condition that a bottom of the substrate 68 is in contact with a top of the supporting portion 58.

The supporting portion 58 has a smaller diameter than diameter of the substrate 68, that is, the top of the supporting portion 58 has a smaller area than an area of a flat face as the bottom of the substrate 68, and the substrate 68 is supported by the supporting portion 58 with periphery of the substrate 68 being left. Diameter of the substrate 68 is, for example, 300 mm, therefore diameter of the supporting portion 58 is less than 300 mm, and preferably about 100 mm to 250 mm (about ⅓ to ⅚ of outer diameter of the substrate).

The diameter (area) of the supporting portion 58 can be larger than the diameter (area) of the substrate 68. In this case, thickness of the supporting portion 58 is preferably increased.

Thickness in a cylinder-axis direction of the supporting portion 58 is formed larger than thickness of the substrate 68. The thickness of the substrate 68 is, for example, 700 μm, therefore the thickness of the supporting portion 58 is more than 700 μm, and may be 10 mm at maximum, and preferably twice the thickness of the substrate 68 or more, for example 3 mm to 10 mm, more preferably 3 mm to 6 mm, and further preferably 4 mm to 5 mm. The thickness of the supporting portion 58 is larger than the thickness of the placing portion 66. The reason for making the thickness of the substrate 68 to be such thickness is to increase rigidity of the supporting portion 58 itself and suppress deformation of the supporting portion 58 during heat treatment.

If the deformation during heat treatment can be suppressed, the thickness of the silicon supporting-portion 58 is not necessarily formed to be larger than thickness of the substrate 68.

Figure 6:
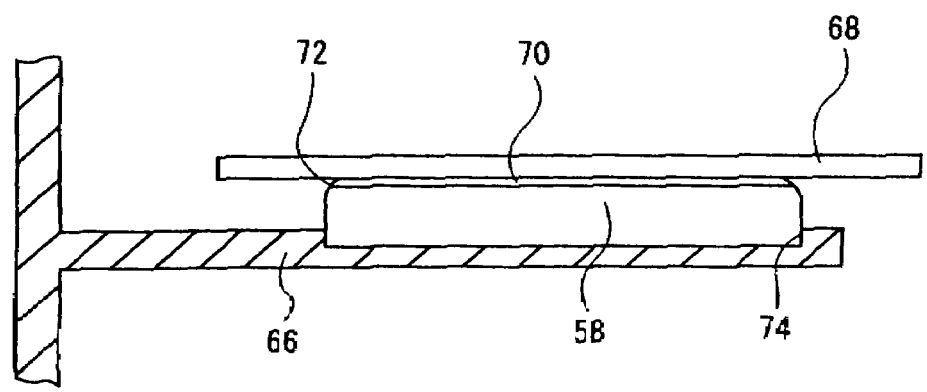
FIG. 6 is a cross section view showing a first modification of the substrate support used in the thermal treatment apparatus according to the embodiment of the invention.

As shown in FIG. 6, it is acceptable that a circular fitting groove 74 is formed in the placing portion 66 corresponding to the supporting portion 58, and the supporting portion 58 is fitted in the fitting groove 74. The total thickness of the supporting portion 58 and the placing portion 66 can be reduced without reducing the thickness of the supporting portion 58, thereby the number of substrates 68 to be treated at a time can be increased. In addition, the supporting portion 58 is fitted in the fitting groove 74, thereby a position of the supporting portion 58 can be stabilized. In this case, a slight gap may be formed between the supporting portion 58 and the fitting groove 74 in consideration of thermal expansion.

Figure 7A:
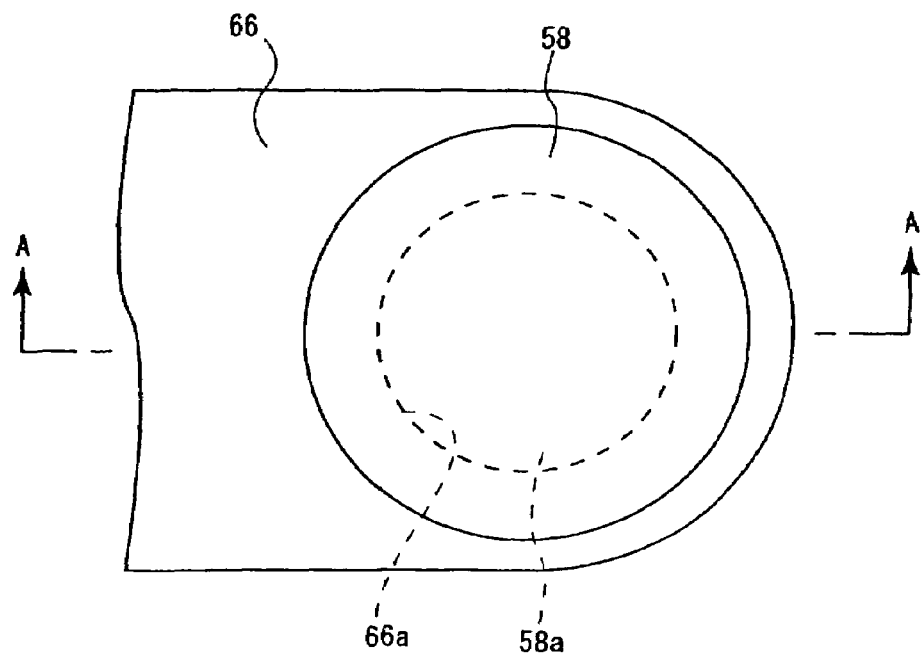
FIG. 7 shows a second modification of the substrate support used in the thermal treatment apparatus according to the embodiment of the invention, wherein (a) is a plan view, and (b) is a cross section view along a line A-A of (a)
Figure 7B:
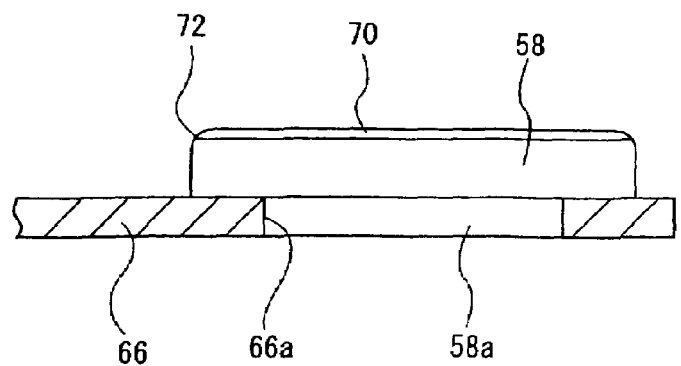

Moreover, as shown in FIG. 7, it is acceptable that an opening 66a is provided in the placing portion 66, a convex portion 58a fitted in the opening 66a is provided on the bottom of the supporting portion 58, and the convex portion 58a on the supporting portion 58 is fitted in the opening 66a in the placing portion 66. In the invention, a member having such a shape is assumed to be included in the platelike member. Again in this case, it is better that the slight gap is formed between the convex portion 58a on the supporting portion 58 and the opening 66a in the placing portion 66 in consideration of thermal expansion.

The shape of the supporting portion 58 need not be cylindrical unlike the embodiment, and can be configured as an elliptic cylinder or a polygonal cylinder. The supporting portion 58 can be fixed to the placing portion 66.

An anti-adhesion layer (coated film) 70 is formed on the top (substrate-placing face) of the supporting portion 58 at a side of the substrate 68. The anti-adhesion layer 70 comprises a material having excellent heat resistance and wear resistance, including a silicon nitride ($Si_3N_4$) film, a silicon carbide (SiC) film, a silicon oxide ($SiO_2$) film, glassy carbon, and microcrystalline diamond, which are formed by surface treatment of the silicon, or by depositing the material on the surface of the silicon using CVD (plasma CVD or thermal CVD) and the like, so that adhesion between the supporting portion 58 and the substrate 68 is prevented after treatment of the substrate 68. When the anti-adhesion layer 70 comprises the silicon carbide (SiC) film, thickness of the film is preferably in a range of 0.1 μm to 50 μm. When the thickness of the silicon carbide film 70 is increased, the silicon supporting-portion 58 is stretched by the silicon carbide film 70 due to difference in coefficients of thermal expansion between silicon and silicon carbide, thereby deformation level of the supporting portion as a whole becomes large, and slip may occur in the substrate 68 due to the large deformation. On the contrary, when the silicon carbide film 70 has the thickness as above, the stretched level of the silicon supporting-portion 58 by the silicon carbide film 70 is reduced, resulting in decrease in deformation level of the supporting portion as a whole. That is, when the thickness of the silicon carbide film 70 is decreased, stress due to the difference in coefficients of thermal expansion between the supporting portion 58 and the film 70 is reduced, and the deformation level of the supporting portion as a whole is reduced, in addition, the thermal expansion coefficient of the supporting portion as a whole approaches the original thermal expansion coefficient of silicon (approximately equal thermal expansion coefficient of the substrate 68 when the substrate comprises silicon), and consequently occurrence of the slip can be prevented.

When the thickness of the silicon carbide film 70 is less than 0.1 μm, the silicon carbide film 70 wears because of excessively small thickness of the film, therefore the silicon carbide needs to be recoated on the silicon supporting-portion 58, and one supporting portion 58 can not be repeatedly used. When the thickness of the silicon carbide film 70 is 0.1 μm or more, the silicon carbide film 70 need not be frequently recoated on the silicon supporting-portion 58, and one supporting portion 58 can be repeatedly used. The silicon carbide film 70 having a thickness of 1 μm or more is preferable, because the wear of the film is further reduced, and the number of repeatable use of one supporting portion 58 is further increased.

When the thickness of the silicon carbide film 70 is more than 50 μm, the silicon carbide film 70 itself is easily cracked, and the slip is easy to occur in the substance due to the crack. When the thickness of the film 70 is 50 μm or less, the crack in the film 70 is hard to occur, and the stress due to the difference in coefficients of thermal expansion between the silicon supporting-portion 58 and the silicon carbide film 70 is reduced as above, therefore the deformation of the supporting portion as a whole is reduced, consequently the occurrence of the slip in the substrate can be prevented. When the thickness of the silicon carbide film is 15 μm or less, the slip in the substrate is hard to occur. Furthermore, when the thickness of the silicon carbide film 70 is 0.1 μm to 3 μm, the slip in the substrate 68 does not occur. Accordingly, the thickness of the silicon carbide film 70 is preferably 0.1 μm to 50 μm, more preferably 0.1 μm to 15 μm, and further preferably 0.1 μm to 3 μm.

When the thickness of the silicon supporting-portion 58 and the thickness of the silicon carbide film 70 are shown in a ratio between the two, the thickness of the silicon carbide film 70 is preferably 0.0025% to 1.25% of the thickness of the silicon supporting-portion 58, more preferably 0.0025% to 0.38%, and further preferably 0.0025% to 0.25%.

The film 70 can be also formed by coating the silicon nitride ($Si_3N_4$) in addition to the silicon carbide using the plasma CVD or the thermal CVD. When the film is formed from the silicon nitride, the thickness of the film 70 is preferably 0.1 μm to 30 μm, and more preferably 0.1 μm to 5 μm.

Periphery of the top of the supporting portion 58 is smoothly chamfered and thus a concave portion 72 is formed. The concave portion 72 prevents production of flaw and the like in the substrate 68 by the substrate 68 contacting to the periphery of the supporting portion 58.

Figure 8A:
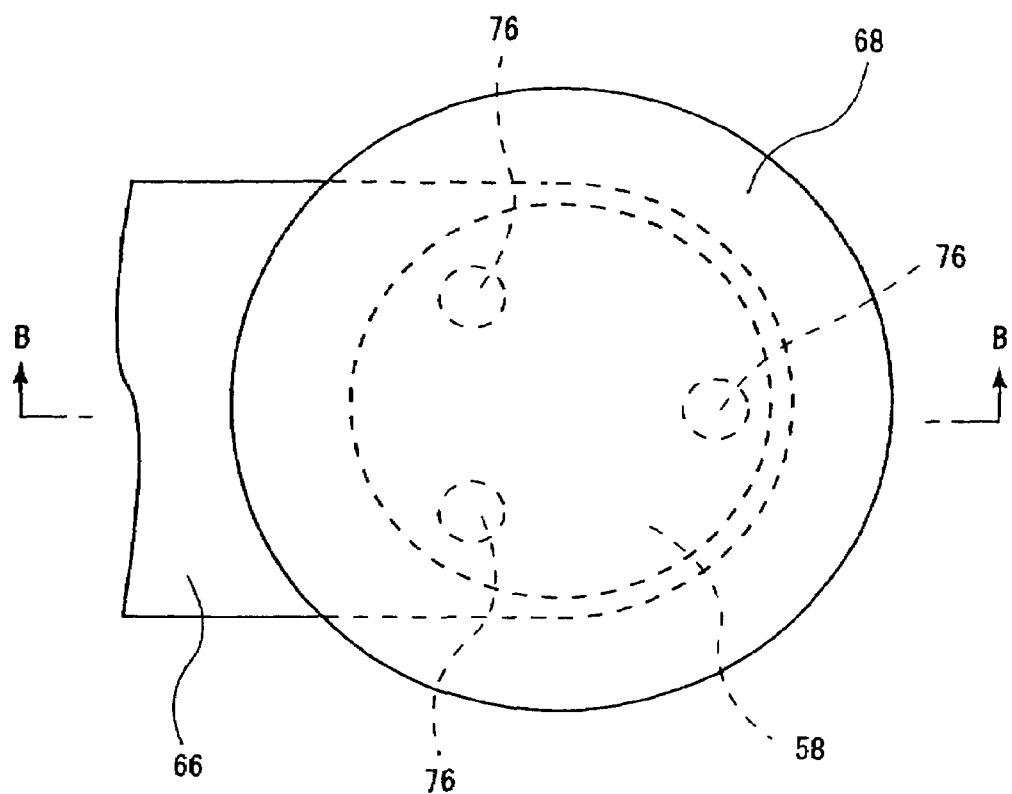
FIG. 8 shows a third modification of the substrate support used in the thermal treatment apparatus according to the embodiment of the invention, wherein (a) is a plan view, and (b) is a cross section view along a line B-B of (a)
Figure 8B:
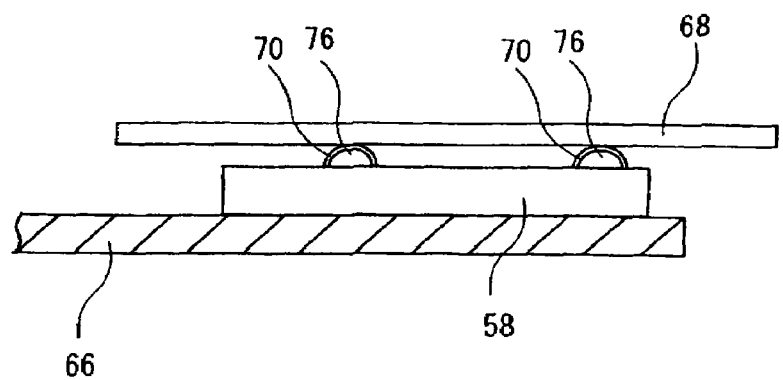

Although the anti-adhesion layer 70 is formed on the entire surface of the supporting portion 58, as shown in FIG. 8, it is acceptable that chips 76 comprising those materials are placed on a part of the substrate-placing face of the supporting portion 58, and the substrate 68 is supported by the chips 76. In this case, three chips 76 or more are preferably provided.

Figure 9:
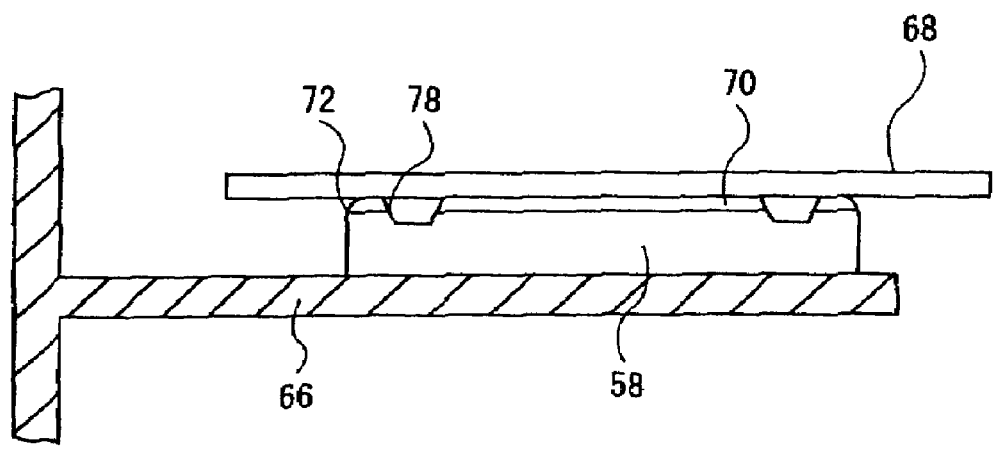
FIG. 9 is a cross section view showing a fourth modification of the substrate support used in the thermal treatment apparatus according to the embodiment of the invention.

As shown in FIG. 9, a concentric groove 78 is formed near the periphery of the supporting portion 58 to decrease an area contacting to the substrate 68, thereby possibility of the flaw produced by the substrate 68 contacting to the supporting portion 58 can be reduced, and shift of the substrate 68 can be prevented.

In the embodiment, since the thickness of the supporting portion 58 is a predetermined thickness larger than the thickness of the substrate 68 as above, rigidity of the supporting portion 58 can be increased, the deformation of the supporting portion 58 with temperature change during carrying-in of the substrate, heating, cooling, heat treatment, carrying-out of the substrate and the like can be suppressed. Accordingly, the slip occurring in the substrate 68 due to the deformation of the supporting portion 58 can be prevented. Moreover, since the material of the supporting portion 58 is made of silicon that is the same material as the substrate 68, that is, since a material having the same thermal expansion coefficient or hardness as the substrate 68 made of silicon is used, difference in thermal expansion or thermal contraction between the substrate 68 and the supporting portion 58 with temperature change can be eliminated, and even if stress is generated at a contact point between the substrate 68 and the supporting portion 58, the stress is easily released, therefore the substrate 68 is hardly flawed. Accordingly, the slip occurring in the substrate 68 due to the difference in coefficients of thermal expansion or hardness between the substrate 68 and the supporting portion 58 can be prevented.

While a case that the diameter (area) of the supporting portion is smaller than that of the substrate was described in the embodiment and example, the diameter of the supporting portion can be larger than that of the substrate. In this case, the thickness of the supporting portion 58 needs to be further increased to secure the rigidity of the supporting portion 58.

Since the supporting portion 58 is coated with the anti-adhesion film 70 such as silicon carbide film, adhesion due to heat generated between the supporting portion 58 and the substrate 68 can be prevented. Since the film 70 is formed to have small thickness as above, the stress due to the difference in coefficients of thermal expansion between the supporting portion 58 and the film 70 can be reduced, and the thermal expansion coefficient of the entire supporting portion including the film 70 can be maintained to be approximately equal to the original thermal expansion coefficient of silicon without having an adverse influence upon the thermal expansion coefficient of the silicon supporting-portion 58. The film 70 may be coated on a back or sides of the supporting portion 58.

In FIG. 10, various modifications on the supporting portion 58 are shown.

Figure 10A:
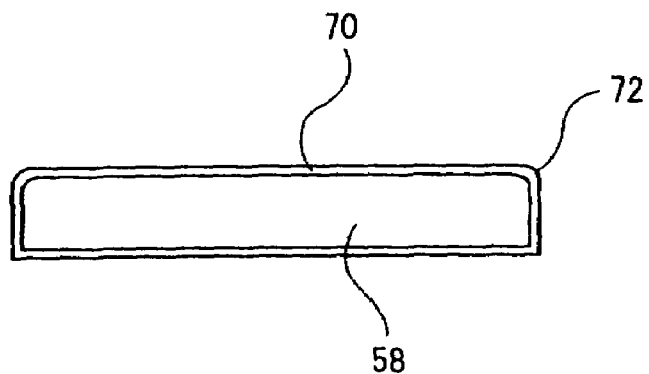
FIG. 10 is a cross section view showing various modifications of the supporting portion.

Although the film 70 was formed only on the substrate-placing face of the supporting portion 58 in the above embodiment, as shown in FIG. 10(a), the film 70 may be formed on the supporting portion 58 as a whole, that is, it may be formed on the front (substrate-placing face), sides and back of the supporting portion 58.

Figure 10B:
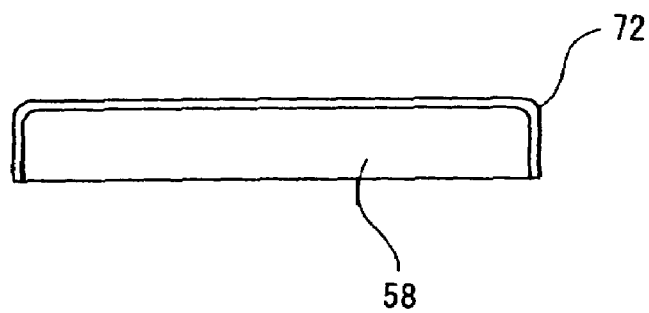

As shown in FIG. 10(b), the film 70 can be formed on the front (substrate-placing face) and sides of the supporting portion 58 except for the back of the supporting portion 58.

Figure 10C:
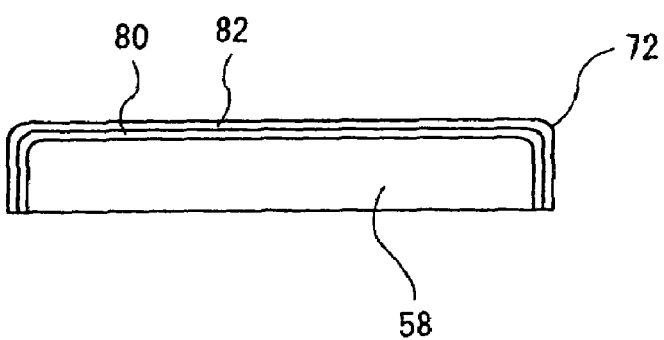

Moreover, the film 70 is not limited to a single layer, and may be formed as multiple layers, for example as shown in FIG. 10(C), a second film 82 can be formed on a first film 80. The first film 80 comprises, for example, the silicon carbide (SiC), silicon nitride ($Si_3N_4$), polycrystalline silicon (Poly-Si), silicon oxide ($SiO_2$), glassy carbon, or microcrystalline diamond. When the film is formed from the silicon carbide or the silicon nitride, it can be formed using the plasma CVD or the thermal CVD as described before. The second film 82 can be formed from a material having lower hardness than that of the first film 70 during heat treatment, for example, silicon oxide ($SiO_2$). Thus, the second film 82 that is the uppermost surface comprises the material having the lower hardness than that of the first film 70 during heat treatment, thereby when the stress is generated at the contact point between the substrate 68 and the supporting portion 58 during high-temperature heat treatment, the stress is easily released, therefore the substrate 68 is hardly flawed, consequently the slip is hard to occur. In particular, when the uppermost film 70 comprises $SiO_2$ having lower hardness than that of the substrate (Si) 68 during heat treatment, the $SiO_2$ having the lower hardness is broken and thus the stress is released during the heat treatment, therefore the substrate 68 having the higher hardness is not flawed, and the slip does not occur. That is, it is further preferable that the uppermost surface comprises a material having hardness lower than that of other films and lower than that of the substrate during heat treatment.

The uppermost $SiO_2$ is preferably amorphous. The substrate 68 and the supporting portion 58 are fused at the contact point between them at high temperature, and when the contact point between the substrate 68 and the supporting portion 58 is crystalline at that time, since the crystalline portion does not flow viscously, the stress due to the difference between coefficients of thermal expansion can not be released, and finally the slip occurs in either the substrate 68 or the supporting portion 58. On the contrary, when the contact point between the supporting portion 58 and the substrate 68 is amorphous, since the amorphous portion flows viscously, even if the substrate 68 and the supporting portion 58 are fused, the stress generated at the contact point can be released, and the substrate 68 is not flawed, and the occurrence of the slip can be prevented.

Figure 10D:
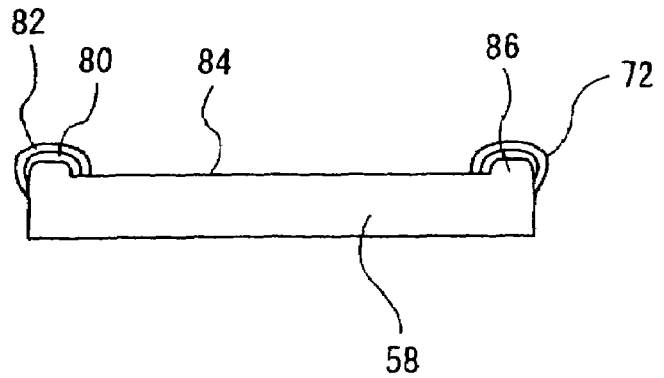

As shown in FIG. 10(d), it is better that the supporting portion 58 is cut out with the periphery of the substrate-placing face of the supporting portion 58 being left, and formed from the cut-out portion 84 formed circularly at a center side and a projection portion 86 formed annularly at the periphery, and the first film 80 and the second film 82 are formed on the substrate-placing face and the sides of the projection portion 86. Accordingly, an area contacted with the substrate 68 can be reduced.

While the second film 82 can be formed using the CVD and the like similarly as the first film 80, it may be formed naturally when the substrate 68 is treated as described later.

FIRST EXAMPLE

Figure 11:
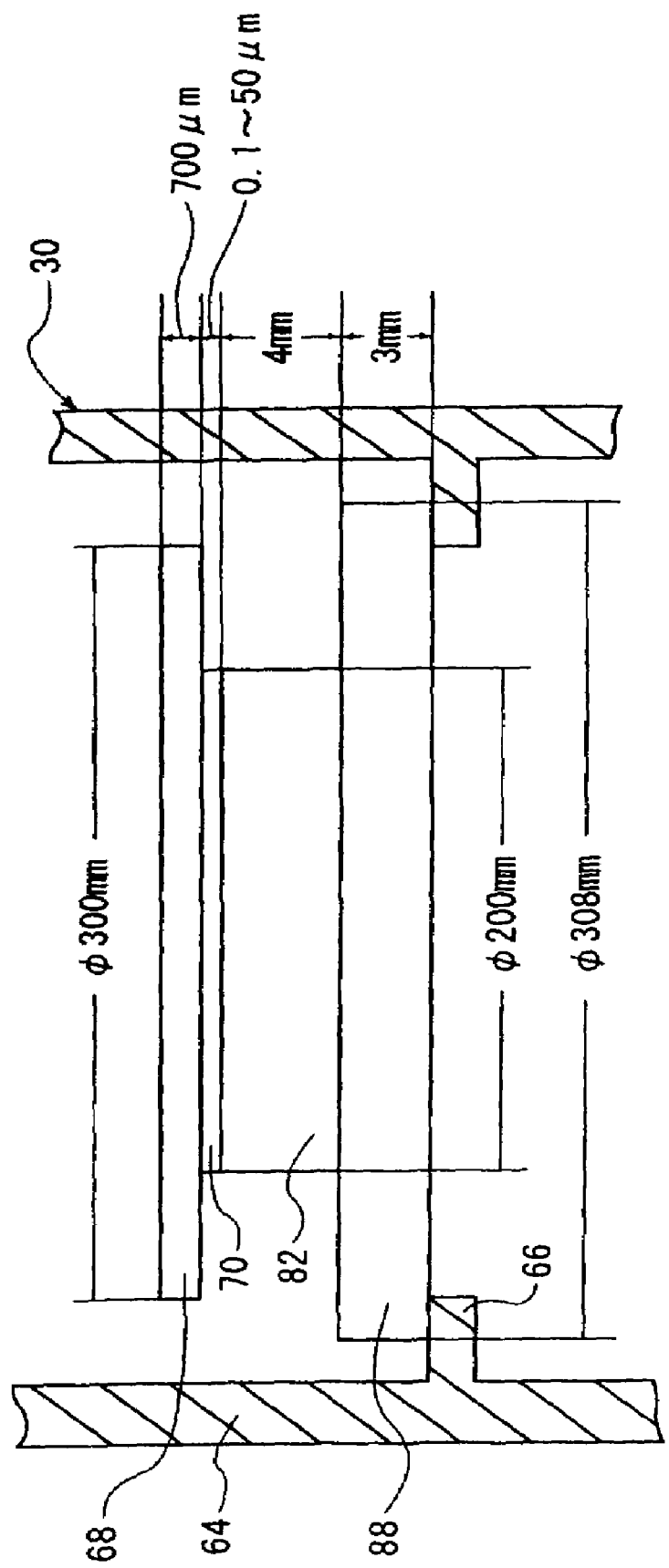
FIG. 11 is a cross section view showing a substrate support used in thermal treatment apparatus according to another embodiment of the invention.

FIG. 11 shows a first example according to the invention. In the substrate support 30 having the body portion comprising, for example, silicon carbide as the above embodiment, the placing portions 66 are formed protrusively from and parallel to the pole 64. Multiple poles, for example, three to four poles are provided as the pole 64. A plate (base) 88 comprises a cylindrical platelike-member made of, for example, silicon carbide (SiC), and a bottom periphery of the plate 88 is supported by the placing portion 66. The supporting portion 82 comprises a cylindrical platelike member made of silicon (Si), and placed on a top of the plate 88. The anti-adhesion layer 70 comprising, for example, silicon carbide is formed on the top of the supporting portion 82. The anti-adhesion layer 70 is preferably 0.1 μm to 50 μm thick. The substrate 68 is supported by the supporting portion 82 via the anti-adhesion layer 70.

While thickness of the plate 88 and thickness of the supporting portion 82 are preferably larger than the thickness of the substrate 68 respectively, only the thickness of the supporting portion 82 may be larger than the thickness of the substrate 68.

The plate 88 was 308 mm in diameter Φ and 3 mm in thickness. The supporting portion 82 was 200 mm in diameter Φ and 4 mm in thickness. The substrate 68 is a silicon wafer having a diameter Φ of 300 mm and a thickness of 700 μm. The anti-adhesion layer 70 comprising silicon carbide was 0.1 μm to 50 μm thick. In heat treatment, the substrate 68 supported by the substrate support 30 was loaded into a reactor held at a temperature of 600° C., and after loading the substrate, an inside of the reactor was heated to 1200° C. or 1350° C. as treatment temperature, and then nitrogen ($N_2$) gas and oxygen ($O_2$) gas were introduced and the inside of the reactor was maintained at the treatment temperature for a predetermined time, and then the reactor temperature was cooled to 600° C. and the substrate 68 supported by the substrate support 30 was unloaded. The heating or cooling was performed in multiple steps such that the heating or cooling rate of the substrate 68 was decreased with temperature increase. The reason why the heating or cooling was performed in the multiple steps in this way (the reason why the heating or cooling rate was decreased with temperature increase) is because if temperature is suddenly changed at high temperature, the temperature is not changed uniformly in a substrate plane, causing the slip. The heat treatment time was about 13 to 14 hours in total. As a result, the slip occurring in the substrate 68 was not found in both cases of the treatment temperature of 1200° C. and 1350° C.

SECOND EXAMPLE

Figure 12:
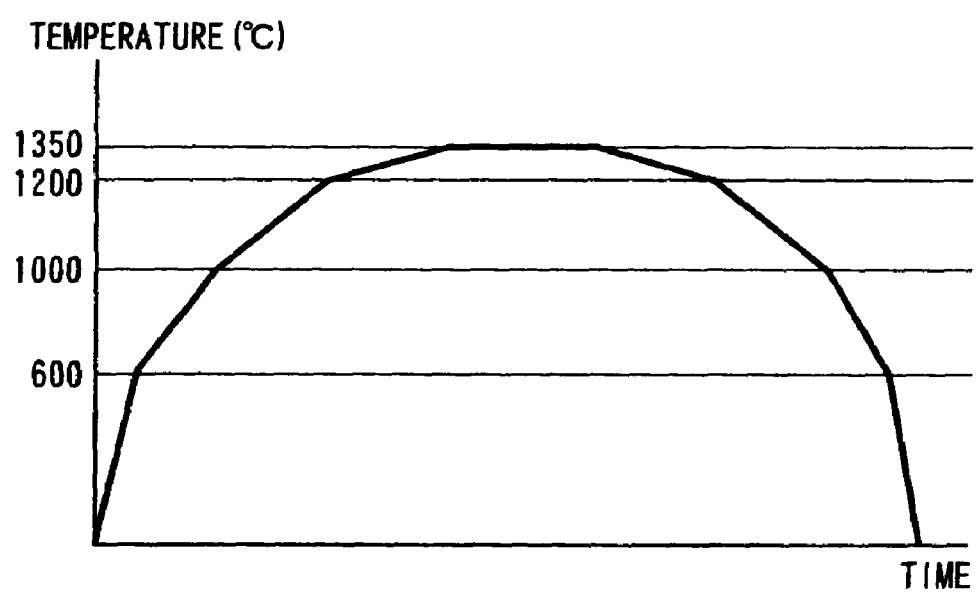
FIG. 12 is a diagram showing temperature change during treating a substrate in the embodiment of the invention.

FIG. 12 shows a second example according to the invention. In the substrate support 30 having the body portion comprising, for example, the silicon carbide similarly as the above embodiment, placing portions 66 are formed protrusively from and parallel to the pole 64. The multiple poles, for example, three to four poles are provided as the pole 64. The plate (base) 88 comprises the cylindrical platelike-member made of, for example, silicon carbide (SiC), and the bottom periphery of the plate 88 is supported by the placing portion 66. The supporting portion 58 made of silicon (Si) comprising the cylindrical platelike-member is placed on the plate 88. The anti-adhesion layer 70 comprising, for example, silicon carbide is formed on a top of the supporting portion 58.

The silicon carbide plate 88 having a thickness of 2.5 mm to 3 mm and a diameter Φ of 308 mm was supported by the substrate support 30 having the body portion made of silicon carbide, and the silicon supporting-portion 58 having a thickness of 4 mm and a diameter Φ of 200 mm, whose substrate-placing face is coated with the silicon carbide film 70 as the anti-adhesion layer, was placed thereon, and the substrate 68 that was a silicon wafer having a thickness of 700 μm and a diameter Φ of 300 mm was placed thereon. In the heat treatment, as shown in FIG. 12, the substrate 68 supported by the substrate support 30 was loaded into the reactor held at a temperature of 600° C., and after loading the substrate, the inside of the reactor was heated to 1350° C. while the treatment temperature at a heating rate was stepwise changed, and then the nitrogen ($N_2$) gas and the oxygen ($O_2$) gas were introduced and the inside of the reactor was maintained at the treatment temperature for a predetermined time, and then reactor temperature was cooled to 600° C. at a cooling rate which was stepwise changed and the substrate 68 supported by the substrate support 30 was unloaded. The heating or cooling rate of the substrate 68 was decreased with temperature increase. That is, the heating rate was set such that a heating rate from 600° C. to 1000° C. was lower than a heating rate from the room temperature to 600° C., a heating rate from 1000° C. to 1200° C. was lower than the heating rate from 600° C. to 1000° C., and a heating rate from 1200° C. to 1350° C. was lower than the heating rate from 1000° C. to 1200° C. Conversely, the cooling rate was set such that a cooling rate from 1350° C. to 1200° C. was lower than a cooling rate from the 1200° C. to 1000° C., the cooling rate from 1200° C. to 1000° C. was lower than a cooling rate from 1000° C. to 600° C., and the cooling rate from 1000° C. to 600° C. was lower than a cooling rate from 600° C. to the room temperature. The reason why the heating or cooling was performed in the multiple steps in this way (the reason why the heating or cooling rate was decreased with temperature increase) is because if temperature is suddenly changed at high temperature, the temperature is not changed uniformly in the substrate plane, causing the slip. The heat treatment time was about 13 to 14 hours in total. As a result, when the silicon carbide film 70 was 0.1 μm to 3 μm thick, the slip did not occur in the substrate 68. When the film 70 was 15 μm or 50 μm thick, the slip was hard to occur in the substrate 68.

The example was repeated, as a result it was found that the slip was hard to occur in and after the second evaluation compared with the first evaluation. It is considered that this is because an amorphous $SiO_2$ film is formed on a surface of the film 70 on the supporting portion 58 in the heat treatment at a $N_2$ or $O_2$ atmosphere in the first evaluation. The amorphous $SiO_2$ film is formed on the uppermost surface of the supporting portion 58, thereby hardness of the contact portion between the supporting portion 58 and the substrate 68 is lowered during heat treatment compared with the film 70 made of SiC or the substrate 68 made of Si, and even if stress is generated at the contact point between the substrate 68 and the supporting portion 58 during the high-temperature heat treatment, the stress can be released. Moreover, since the $SiO_2$ is amorphous, even if the substrate 68 and the supporting portion 58 are fused at the contact point between them during the high-temperature heat treatment, the stress generated at the contact point, which was fused due to viscous flowing of an amorphous portion, can be released by viscous flowing (viscous deformation) of the amorphous $SiO_2$. As a result, it is considered that the flaw produced in the substrate 68 during the high-temperature heat treatment in and after the second evaluation can be suppressed, and thus the slip occurring in the substrate 68 can be suppressed.

While a case that the amorphous $SiO_2$ film was formed on the surface of the film 70 made of SiC provided on the top of the supporting portion 58 made of Si was described in the example, it is appreciated that the amorphous $SiO_2$ may be applied directly on the surface of the supporting portion 58 made of Si.

While batch-type apparatus for heat-treating a plural number of substrates was used as the thermal treatment apparatus in the description of the embodiments and examples, the apparatus is not limited to this, and may be sheet-type apparatus.

The thermal treatment apparatus of the invention can be applied to a manufacturing process of the substrate.

An example that the thermal treatment apparatus of the invention is applied to one step of a manufacturing process of a SIMOX (Separation by Implanted Oxygen) wafer which is one of SOI (Silicon On Insulator) wafers is described.

First, ion implantation of oxygen ions is performed into a single-crystal silicon wafer using ion implantation apparatus and the like. Then, the wafer into which the oxygen ions have been implanted is annealed at a high temperature of 1300° C. to 1400° C., for example 1350° C. or more, in an atmosphere of, for example, Ar or $O_2$ using the thermal treatment apparatus in the above embodiments. A SIMOX wafer having a $SiO_2$ layer formed within the wafer (embedded $SiO_2$ layer) is prepared by performing these treatments.

In addition to the SIMOX wafer, the thermal treatment apparatus of the invention can be applied to one step of a manufacturing process of a hydrogen annealing wafer. In this case, the wafer is annealed at a high-temperature of 1200° C. or more in a hydrogen atmosphere using the thermal treatment apparatus of the invention. Accordingly, crystal defects in a wafer surface layer where IC (Integrated Circuit) is produced can be reduced, and crystal integrity can be improved.

In addition to this, the thermal treatment apparatus of the invention can be applied to one step of a manufacturing process of an epitaxial wafer.

Even in a case that the high-temperature annealing is performed as one step in the manufacturing processes of the substrates as above, the slip occurring in the substrate can be prevented by using the thermal treatment apparatus of the invention.

In addition, the thermal treatment apparatus of the invention can be applied to a manufacturing process of a semiconductor device.

In particular, the apparatus is preferably applied to a thermal treatment process performed at a relatively high temperature, for example, a thermal oxidation process such as wet oxidation, dry oxidation, hydrogen combustion oxidation (pyrogenic oxidation), and HCl oxidation, or a thermal diffusion process for diffusing an impurity (dopant) such as boron (B), phosphorous (P), arsenal (As), and antimony (Sb) into a semiconductor thin film.

Even in a case that such a heat treatment process is performed as one step in the manufacturing process of the semiconductor device, occurrence of the slip can be prevented by using the thermal treatment apparatus of the invention.

As above, the invention is characterized in the matters described in claims, and the invention further includes the following embodiments.

(1) The thermal treatment apparatus according to claim 1, wherein thickness of the supporting portion is at least twice the thickness of the substrate.

(2) The thermal treatment apparatus according to claim 1, wherein the body portion has a placing portion for placing, the supporting portion, and thickness of the supporting portion is larger than thickness of the placing portion.

(3) The thermal treatment apparatus according to claim 1, wherein the supporting portion has a substrate-placing face, on which the substrate is placed, and one or a plural number of materials of silicon nitride ($Si_3N_4$), silicon carbide (SiC), silicon oxide ($SiO_2$), glassy carbon, and microcrystalline diamond is/are coated on the substrate-placing face.

(4) The thermal treatment apparatus according to claim 1, wherein the supporting portion has the substrate-placing face, on which the substrate is placed, and one or a plural number of chip/chips comprising one or a plural number of materials of silicon nitride ($Si_3N_4$), silicon carbide (SiC), silicon oxide ($SiO_2$), glassy carbon, and microcrystalline diamond is/are provided on the substrate-placing face.

(5) The thermal treatment apparatus according to claim 1, wherein the supporting portion has the substrate-placing face, on which the substrate is placed, and a concave portion or a groove concentric with the substrate is formed on the substrate-placing face.

(6) The thermal treatment apparatus according to claim 1, wherein the supporting portion has the substrate-placing face, on which the substrate is placed, and the concave portion or the groove concentric with the substrate is formed on periphery of the substrate-placing face.

(7) The thermal treatment apparatus according to claim 1, wherein the main body has the placing portion for placing the supporting portion, and a fitting groove in which the supporting portion is fitted is formed in the placing portion.

(8) The thermal treatment apparatus according to claim 1, wherein the main body has the placing portion for placing the supporting portion, and an opening or a groove is formed in the placing portion, a convex portion which is fitted in the opening or the groove is formed on the supporting portion, and the convex portion on the supporting portion is fitted in the opening or the groove.

(9) The thermal treatment apparatus according to claim 1, wherein an area of the substrate-placing face of the supporting portion is smaller than an area of a flat face of the substrate.

(10) The thermal treatment apparatus according to claim 1, wherein the supporting portion is cylindrical, and the diameter of the supporting portion is smaller than the diameter of the substrate.

(11) The thermal treatment apparatus according to claim 6, wherein the thickness of the silicon carbide film is 0.0025% to 1.25% of the thickness of the supporting portion.

(12) The thermal treatment apparatus according to claim 6, wherein the thickness of the silicon carbide film is 0.0025% to 0.38% of the thickness of the supporting portion.

(13) The thermal treatment apparatus according to claim 6, wherein the thickness of the silicon carbide film is 0.0025% to 0.25% of the thickness of the supporting portion.

(14) The thermal treatment apparatus according to claim 6, wherein a silicon oxide ($SiO_2$) film is formed on an uppermost face of the supporting portion.

(15) The thermal treatment apparatus according to claim 10, wherein the plural number of films comprise two types of films, and one of them is a silicon carbide (SiC) film, and an uppermost film is a silicon oxide ($SiO_2$) film.

(16) The thermal treatment apparatus according to claim 1, wherein a composition of the body portion is silicon carbide (SiC).

(17) The thermal treatment apparatus according to claim 1, wherein the substrate support is configured such that a plural number of substrates are supported approximately horizontally with a gap in a plural number of stages.

(18) The thermal treatment apparatus according to claim 1, wherein the heat treatment is performed at a temperature of 1000° C. or more.

(19) The thermal treatment apparatus according to claim 1, wherein the heat treatment is performed at a temperature of 1350° C. or more.

(20) A method for treating a substrate, comprising a process for carrying a substrate into a treatment room; a process for supporting the substrate by a supporting portion formed from a silicon platelike-member having a thickness larger than the thickness of the substrate; a process for heat-treating the substrate in the treatment room with the substrate being supported by the supporting portion; and a process for carrying out the substrate from the treatment room.

(21) A method for treating a substrate, comprising a process for carrying a substrate into a treatment room; a process for supporting the substrate by a silicon supporting-portion wherein a substrate-placing face, on which the substrate is placed, is coated with a film comprising one or a plural number of materials of silicon carbide (SiC), silicon oxide ($SiO_2$), glassy carbon, and microcrystalline diamond; a process for heat-treating the substrate in the treatment room with the substrate being supported by the supporting portion; and a process for carrying out the substrate from the treatment room.

(22) A method for manufacturing a substrate, comprising a process for carrying a substrate into a treatment room; a process for supporting the substrate by a silicon supporting-portion wherein a plural number of different films are stacked on a substrate-placing face, on which the substrate is placed, and the hardness of an uppermost film is the lowest in the plural number of films at heat treatment temperature, or the uppermost film is amorphous; a process for heat-treating the substrate in the treatment room with the substrate being supported by the supporting portion; and a process for carrying out the substrate from the treatment room.

(23) A method for manufacturing a semiconductor device, comprising a process for carrying a substrate into a treatment room; a process for supporting the substrate by a silicon supporting-portion wherein a plural number of different films are stacked on a substrate-placing face, on which the substrate is placed, and the hardness of an uppermost film is the lowest in the plural number of films at heat treatment temperature, or the uppermost film is amorphous; a process for heat-treating the substrate in the treatment room with the substrate being supported by the supporting portion; and a process for carrying out the substrate from the treatment room.

(24) A method for treating a substrate, comprising a process for carrying a substrate into a treatment room; a process for supporting the substrate by a silicon supporting-portion wherein a plural number of different films are stacked on a substrate-placing face, on which the substrate is placed, and the hardness of an uppermost film is the lowest in the plural number of films at heat treatment temperature, or the uppermost film is amorphous; a process for heat-treating the substrate in the treatment room with the substrate being supported by the supporting portion; and a process for carrying out the substrate from the treatment room.

(25) A method for manufacturing a substrate, comprising a process for carrying a substrate into a treatment room; a process for supporting the substrate by a silicon supporting-portion wherein a silicon carbide (SiC) film is formed on a substrate-placing face, on which the substrate is placed, in addition, a silicon oxide ($SiO_2$) film is formed on an uppermost face; a process for heat-treating the substrate in the treatment room with the substrate being supported by the supporting portion; and a process for carrying out the substrate from the treatment room.

(26) A method for manufacturing a semiconductor device, comprising a process for carrying a substrate into a treatment room; a process for supporting the substrate by a silicon supporting-portion wherein a silicon carbide (SiC) film is formed on a substrate-placing face, on which the substrate is placed, in addition, a silicon oxide ($SiO_2$) film is formed on an uppermost face; a process for heat-treating the substrate in the treatment room with the substrate being supported by the supporting portion; and a process for carrying out the substrate from the treatment room.

(27) A method for treating a substrate, comprising a process for carrying a substrate into a treatment room; a process for supporting the substrate by a silicon supporting-portion wherein a silicon carbide (SiC) film is formed on a substrate-placing face, on which the substrate is placed, in addition, a silicon oxide ($SiO_2$) film is formed on an uppermost face; a process for heat-treating the substrate in the treatment room with the substrate being supported by the supporting portion; and a process for carrying out the substrate from the treatment room.

(28) A method for manufacturing a substrate, comprising a process for carrying a substrate into a treatment room; a process for supporting the substrate by a silicon supporting-portion wherein a coating film is formed on a substrate-placing face, on which the substrate is placed, and the hardness of the coating film is lower than the hardness of the substrate during heat treatment at heat treatment temperature, or the coating film is amorphous; a process for heat-treating the substrate in the treatment room with the substrate being supported by the supporting portion; and a process for carrying out the substrate from the treatment room.

(29) A method for manufacturing a semiconductor device, comprising a process for carrying a substrate into a treatment room; a process for supporting the substrate by a silicon supporting-portion wherein a coating film is formed on a substrate-placing face, on which the substrate is placed, and the hardness of the coating film is lower than the hardness of the substrate during heat treatment at heat treatment temperature, or the coating film is amorphous; a process for heat-treating the substrate in the treatment room with the substrate being supported by the supporting portion; and a process for carrying out the substrate from the treatment room.

(30) A method for treating a substrate, comprising a process for carrying a substrate into a treatment room; a process for supporting the substrate by a silicon supporting-portion wherein a coating film is formed on a substrate-placing face, on which the substrate is placed, and the hardness of the coating film is lower than the hardness of the substrate during heat treatment at heat treatment temperature, or the coating film is amorphous; a process for heat-treating the substrate in the treatment room with the substrate being supported by the supporting portion; and a process for carrying out the substrate from the treatment room.

As described hereinbefore, according to the invention, since the substrate is supported by the supporting portion formed from the silicon platelike-member having a thickness larger than the thickness of the substrate, the slip dislocation occurring in the substrate can be prevented.

Moreover, according to the invention, since the silicon supporting-portion is coated with the anti-adhesion layer such as silicon carbide film, silicon nitride film, or silicon oxide film, the slip occurring in the substrate can be prevented, and the adhesion between the heat-treated substrate and the supporting portion can be prevented. Moreover, the hardness of the film coated on the substrate-placing face of the supporting portion is lower than the hardness of the substrate during heat treatment in the heat treatment, or the coated film is made amorphous, therefore the slip occurring in the substrate can be further prevented. Moreover, when a plural number of films are coated on the substrate-placing face of the supporting portion, the hardness of the uppermost film is the lowest during heat treatment, or the uppermost film is amorphous, therefore, again in this case, the slip occurring in the substrate can be further prevented.

INDUSTRIAL APPLICABILITY

The invention can be used for thermal treatment apparatus, a method for manufacturing a semiconductor device, and a method for manufacturing a substrate, wherein the occurrence of slip dislocation in a substrate during heat treatment is reduced, and a high-quality semiconductor device can be manufactured.

The invention claimed is:

1. A thermal treatment apparatus comprising:
   a furnace for heat-treating a substrate; and
   a substrate support for supporting the substrate in the furnace,
   wherein the substrate support has a main body portion and a supporting portion provided on the main body portion, the supporting portion being in contact with the substrate,
   the supporting portion is formed from a silicon plate-like member,
   a thickness of the supporting portion is not less than 3 mm and not more than 10 mm, and
   the supporting portion is not in contact with a periphery of the substrate.

2. The thermal treatment apparatus according to claim 1, wherein a substrate-placing face of the supporting portion, on which the substrate is placed, is coated with an amorphous silicon oxide film.

3. A thermal treatment apparatus comprising:
   a furnace for heat-treating a substrate, and
   a substrate support for supporting the substrate in the furnace,
   wherein the substrate support has a main body portion and a supporting portion provided on the main body portion, the supporting portion being in contact with the substrate,
   the supporting portion is formed from a silicon plate-like member,
   a thickness of the supporting portion is not less than 3 mm and not more than 10 mm,
   the supporting portion is not in contact with a periphery of the substrate, and
   a substrate-placing face of the supporting portion, on which the substrate is placed, is coated with a film or films comprising one or more materials including silicon carbide, silicon nitride, polycrystalline silicon, silicon oxide, glassy carbon, and microcrystalline diamond.

4. The thermal treatment apparatus according to claim 3, wherein an uppermost film of the film or the films is an amorphous silicon oxide film.

5. A thermal treatment apparatus comprising:
   a furnace for heat-treating a substrate; and
   a substrate support for supporting the substrate in the furnace,
   wherein the substrate support has a supporting portion which is in contact with the substrate and a main body portion which supports the supporting portion,
   the main body portion is formed from a silicon carbide,
   the supporting portion is formed from a silicon plate-like member and a thickness of the supporting portion is not less than 3 mm and not more than 10 mm,
   a diameter of the supporting portion is smaller than a diameter of the substrate, and
   a substrate-placing face of the supporting portion, on which the substrate is placed, is coated with an amorphous silicon oxide film.

6. A thermal treatment apparatus comprising:
   a furnace for heat-treating a substrate; and
   a substrate support for supporting the substrate in the furnace,
   wherein the substrate support has a supporting portion that is in contact with the substrate and a plate that supports the supporting portion and a main body portion which supports the plate,
   the supporting portion is formed from a silicon plate-like member and a thickness of the supporting portion is not less than 3 mm and not more than 10 mm,
   a diameter of the supporting portion is smaller than a diameter of the substrate and a diameter of the plate, and
   a substrate-placing face of the supporting portion, on which the substrate is placed, is coated with an amorphous silicon oxide film.

7. The thermal treatment apparatus according to claim 6, wherein the plate and the main body portion are formed from a silicon carbide.

* * * * *